United States Patent [19]

Buck

[11] Patent Number: 4,970,386

[45] Date of Patent: Nov. 13, 1990

[54] VERTICAL FET HIGH SPEED OPTICAL SENSOR

[75] Inventor: Daniel C. Buck, Hanover, Md.

[73] Assignee: Westinghouse Electric Corp., Pittsburgh, Pa.

[21] Appl. No.: 370,352

[22] Filed: Jun. 22, 1989

[51] Int. Cl.⁵ .................................................. H01J 5/16
[52] U.S. Cl. .............................. 250/227.24; 350/96.15; 350/96.17
[58] Field of Search ............... 250/227, 227.24; 357/8, 357/19, 17, 30 D, 30 M, 38 LA; 350/96.13, 96.14, 96.15, 96.17

[56] References Cited

U.S. PATENT DOCUMENTS

| | | | |
|---|---|---|---|
| Re. 31,255 | 5/1983 | Geddes | 357/30 M |
| 4,608,584 | 8/1986 | Mihara | |
| 4,623,909 | 11/1986 | Nishizawa et al. | |
| 4,625,225 | 11/1986 | Goodfellow et al. | |
| 4,721,353 | 1/1988 | Khoe et al. | 350/96.17 |
| 4,725,128 | 2/1988 | Bornzin et al. | 357/19 |
| 4,740,823 | 4/1988 | Thompson | |
| 4,744,623 | 5/1988 | Prucnal et al. | 357/30 M |

FOREIGN PATENT DOCUMENTS 1529145 10/1978 United Kingdom .

OTHER PUBLICATIONS

Publication entitled "Fabrication Technology for Monolithic GaAs VFET" by R. C. Clarke et al., Westinghouse Electric Corp. Nov. 18, 1987.

Primary Examiner—David C. Nelms
Assistant Examiner—Que Tan Le
Attorney, Agent, or Firm—W. G. Sutcliff

[57] ABSTRACT

A high speed optical sensor comprising a parallel array of vertical field effect transistors and optical fibers disposed in the recesses between the transistors is disclosed herein. Each of the vertical field effect transistors includes a substrate of doped gallium arsenide divided by a depleted region. One side of each of the gallium arsenide substrates is flanked by an optical fiber which transmits an optical signal into one side of the depleted region, while the other side of the substrate includes a gate electrode for controlling the flow of photo charges induced in the depleted region by the light signals. The gate electrode serves not only to control the flow of charges through the transistor but also reflects back a portion of the light emanated by the optical fiber so that it passes a second time through the depleted region. The efficient light coupling that occurs between the optical fibers and the depleted regions of the substrates of the vertical FET's, in combination with the low capacitive leakage afforded by the design at high frequencies and the high power density obtainable with vertical FET's results in a photosensor which is advantageously efficient, fast the compact.

29 Claims, 3 Drawing Sheets

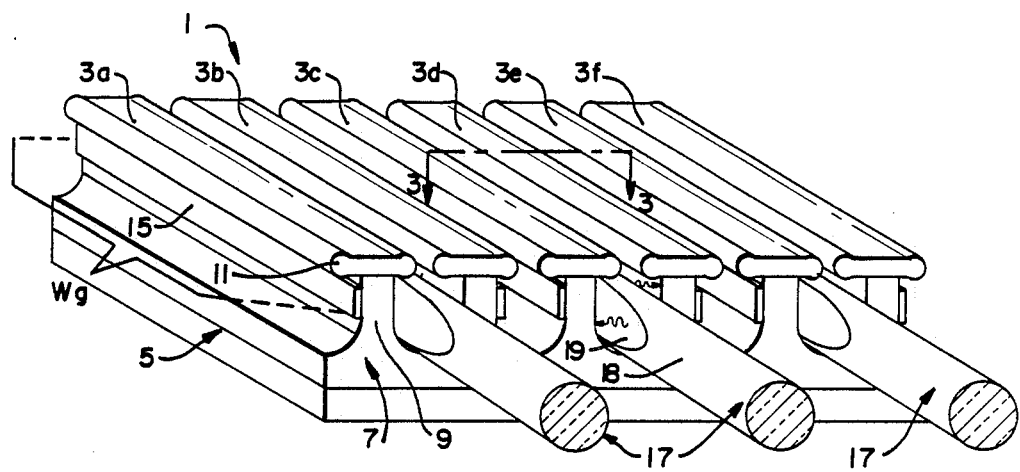
FIG. 1
FIG. 2
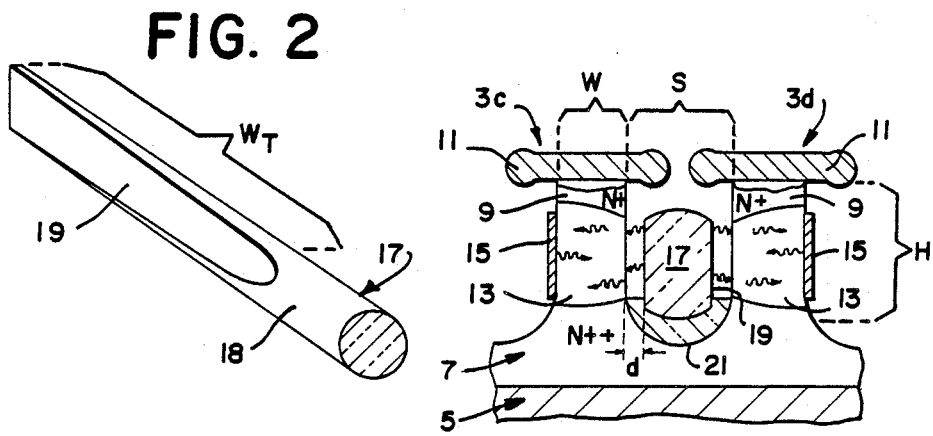
FIG. 3
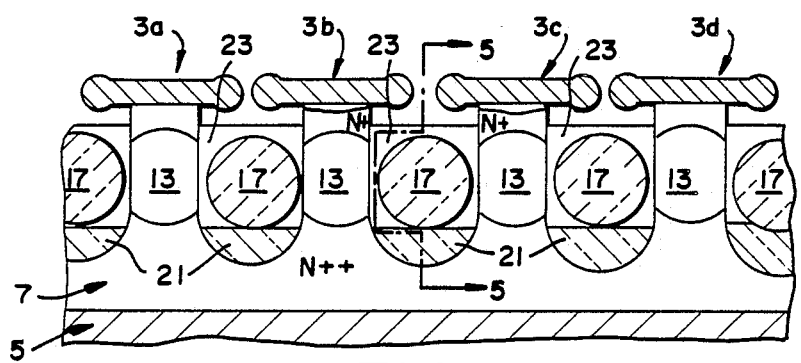
FIG. 4

VERTICAL FET HIGH SPEED OPTICAL SENSOR

BACKGROUND OF THE INVENTION

This invention generally relates to semiconductive photo sensors, and is specifically concerned with a high speed, high power density optical sensor formed from a plurality of optical fibers disposed between the substrates of adjacent segments of a vertical FET Field Effect Transistor, each of which serves an elemental transistor..

Optical photo sensors are well known in the prior art. One prior art design comprises a planar FET having a bottom, heavily doped region electrically connected to a source and a top, lightly doped region that includes a depleted region which is covered by a drain electrode. The drain electrode is typically formed from a layer of gold which is thin enough to transmit light In operation, a biasing voltage is applied across the bottom, heavily doped region of the FET and the drain electrode while a signal-carrying beam of light is focused on the depletion region. Photons from the light beam penetrate the drain electrode and create electron-hole pairs in the depleted region which has the effect of modulating the conductivity of the FET commensurate with the amplitude of the light beam. The resulting pulsating flow of current through the FET is converted into alternating current by means of a bypass capacitor and amplified.

The applicant has observed that the performance of such prior art photo sensors is limited by three factors. The first of these factors is the inefficiency of the optical coupling between the signal carrying light beam and the depleted region of the FET. Despite the thinness of the drain electrode, much of the signal-carrying light is reflected from this electrode before it ever has an opportunity to penetrate the depleted region. In an attempt to solve this problem, some prior art designs have provided a hole about 2 mils. in diameter which provides a direct light path into the depleted region. However, experience has shown that is very difficult to accurately focus a light beam into such a small hole. Hence, much of the signal-carrying light beam is absorbed into the undepleted regions of the semiconductor substrate. A second factor that substantially limits the performance of such prior art optical sensors is the capacitative leakage that occurs between the source and the drain at light frequencies at $10^6$ hertz and beyond. Such capacitative leakage appears to be an intrinsic limitation of the planar topography of such prior art photo sensors where, at high frequencies the broad and flat and closely spaced source and drain electrodes disposed across the semiconductor material act as a capacitor. The third factor limiting the performance of such prior art photo sensors is the limited power density available from such designs. Like the unwanted capacitance that limits high speed performance, the power density limitation again stems from the planar topography of the FETs used in such photo sensors. This limitation as to power density is a significant drawback where micro-miniaturization is desirable, such as in satellite communication circuitry.

Clearly, what is needed is a higher efficiency optical sensor which provides better coupling between the signal-carrying light beam and the photo sensor elements. Ideally, the processing speed of the photo sensor should not be limited by unwanted capacitance at light frequencies of $10^6$ hertz and over. Finally, it would be desirable if the optical sensor were capable of substantially higher power densities

SUMMARY OF THE INVENTION

The invention is a high speed optical sensor that overcomes the shortcomings of the prior art. The invention generally comprises a substrate of semiconductor material connected between a source and a drain and having first and second opposing sides, each of which are transverse with respect to the source in the drain. The substrate includes a doped region, and a depleted region disposed within the doped region that traverses the first and second opposing sides of the substrate. A gate electrode may be disposed on the first side of the substrate over the depleted region for controlling a flow of electrical charges through the substrate. An optical fiber is disposed over the second side of the substrate in spaced relation thereto for transmitting an optical signal directly into the depleted region and thereby creating a flow of electrical charges therein.

In order to maximize the light transmission efficiency of the optical fiber, the fiber is preferably a single mode-type fiber. Additionally, the sides of this fiber are preferably tapered in the regions where the fiber interfaces with the substrate to allow better coupling between the fiber and the depleted region within the substrate. In order to maximize the processing speed of the device, the substrate is preferably formed from gallium arsenide. To minimize to capacitative leakage across the source in the drain, the height of the gate electrode is made no larger than the height of the depleted region through the substrate, and the width of the gate electrode is preferably made less than 10 microns so that the reactance of the capacitance between the source in the drain is well over 200 ohms at 10 GHZ, for example. Additionally, the optical fiber is preferably formed from fused silica or low-dielectric glass and is further potted in place with a transparent potting material having a dielectric constant near unity.

In the preferred embodiment, the semiconductor substrate is the substrate of one of the transistors of a vertical FET array, and the optical fiber is disposed in a recess in the array defined by opposing sides of different transistor substrates, neither of which includes a gate electrode so that the signal emanated from the optical fiber strikes the depleted regions of two adjacent transistors. In the alternative, a gate electrode may be placed on one side of the depleted region that has a mirrored finish for reflecting unabsorbed photons back into the depleted region.

The resulting device is capable of processing signals from light having a wave length on the order of one micrometer while retaining the advantageously high power density of vertical FET arrays.

BRIEF DESCRIPTION OF THE SEVERAL FIGURES

FIG. 1 is a perspective view of the optical sensor of the invention, illustrating how the invention is used in conjunction with a parallel array of VFET transistors;

FIG. 2 is a perspective view of one of the single-mode optical fibers used in the optical sensor illustrated in FIG. 1;

FIG. 3 is a cross-sectional front view of the parallel array of VFET transistors illustrated in FIG. 1;

FIG. 4 is a cross-sectional front view of an alternate embodiment of the invention which likewise utilizes a set of parallel VFET transistors;

DETAILED DESCRIPTION OF THE PREFERRED EMBODIMENT

Figure 5:
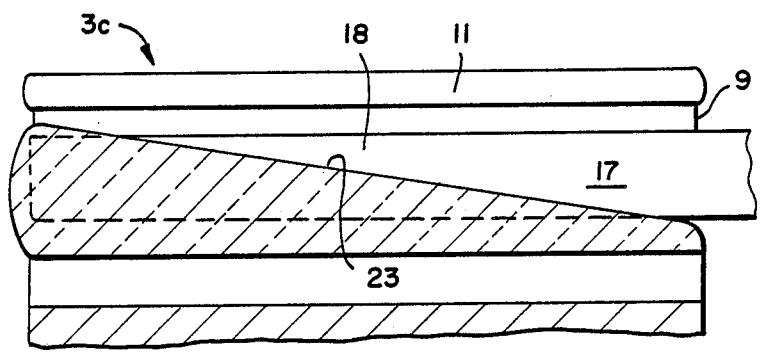
FIG. 5 is a cross-section side view of the VFET array illustrated in FIG. 4 along the line 5—5.

With reference now to FIGS. 1, 2 and 3 wherein like components are designated by like numerals throughout all the several figures, the optical sensor 1 of the invention generally comprises an array of VFET transistors 3a–3f into which a plurality single-mode optical fibers 17 have been mounted adjacent to the depleted zones 13 of these transistors. Each of the VFETs 3a–3f at its bottom a source electrode 5, which may be formed from aluminum that is vapor deposited upon a layer of monolithic gallium arsenide 7 epitaxially grown from N+ layers doped at a density of typically $2 \times 10^{17}$ cm$^3$. Each individual transistor 3a–3f is defined by a vertical pillar 9 that is carved out of this monolithic layer of gallium arsenide 7 by means of reactive ion etching. Such etching is accomplished by first photolithographically depositing a pattern of chromium strips on the upper surface of the layer 7. Preferably this layer of chromium is of approximately 2500 angstroms thick. Next, the layer of gallium arsenide 7 is exposed to a plasma formed by placing a quantity of $CCl_2F_2$ in a radio frequency field of 11.36 MHz between two stainless steel electrodes, one of which is electrically connected to the source electrode 5 of the device 1. The resulting electrical field guides the plasma so that it uniformly etches troughs between the strips of gallium arsenide that are not covered by the photolithographically deposited film of chromium. These troughs, in turn, define the vertical pillars 9 of each of the resulting VFETs. In the preferred embodiment, the width W of each of the pillars 9 is approximately 0.15 microns. This desired width is achieved by wet chemically etching the pillars of gallium arsenide created by the previously described reactive ion etching in a solution of citric acid, water, and hydrogen peroxide. Etching to these dimensions gives a desired gate separation S of approximately 3 microns.

Each of the pillars 9 of the VFETs 3a–3f is crowned by a drain electrode 11. These electrodes 11 are formed after the chromium mask at the top of each of the pillars 9 is stripped out with a dilute solution of hydrogen fluoride in deionized water. A photoresist mask is opened over the tops of each of the pillars 9 and a metal layer of Au/Ge:Ni:Pt at 1500:400:500 angstroms is deposited by electron beam evaporation. After liftoff of unwanted metal, the device 1 is sintered at 460 degrees centigrade in a reducing atmosphere to form ohmic contacts at each drain electrode 11. A photoresist pattern is then used to mask the electrodes 11 and unwanted metal within the troughs of the array of VFETs 3a–3f is removed by reactive ion etching.

Each of the vertical pillars 9 of the VFETs 3a–3f includes a centrally disposed depleted zone 13. In the embodiment illustrated in FIGS. 1, 2 and 3, a gate electrode is deposited over one side of the depleted zone 13 of each of the VFETs as shown, so that one of the sides of the depleted zone 13 remains uncovered. The formation of such gate electrodes 15 is implemented by electron beam evaporation that uses the shadow obtained by adjacent overhanging drain electrodes 11 to control the deposition of the metal that forms the gate electrodes 15. As is evident in FIGS. 1 and 3, gate electrodes 15 are deposited on opposite sides of each of the VFET transistor pairs 3a,3b; 3c,3d and 3e,3f so that the depleted zone 13 of each of these VFET pairs is exposed to the outer surface of the device 1.

An optical fiber 17 is disposed between the exposed regions of each of the pairs of VFETs 3a,3b; 3c,3d and 3e,3f. In the embodiment illustrated in FIGS. 1, 2 and 3, each of these optical fibers 17 is a single mode fiber, one end of which is optically coupled to a source (not shown) of optical signals. The other end of each of these fibers 17 includes a tapered portion 19 whose width is approximately the same as the width W of the gate electrode region illustrated in FIG. 1. The tapering of the portion 19 into a shape resembling that of a common, single bladed screwdriver causes the photons traveling throughout the generally circular cross-section 18 of the fiber to be uniformly emitted throughout the width Wt of the section 19 in the direction of the depleted zones 13 of the two VFETs flanking it thereby efficiently coupling essentially all of the optical signal directed into the fiber 17. In order to secure the tapered portion 19 between two flanking VFETs in the orientation illustrated in FIGS. 1 and 3, a shallow layer of organic dielectric whose dielectric constant is preferably between about 1 and 2 is deposited at the bottom of the trough between the pairs of VFETs and the bottom surface of the tapered portion 19 is potted therein. Polyamide may be used for this purpose.

An important advantage associated with gate electrode configuration of the first embodiment of the invention is illustrated in FIG. 3. Specifically, when the gate electrodes 15 are formed from gold, aluminum, or any other type of reflective metal, some of the photons emanated by the optical fiber 18 through the tapered portion 19 which are not absorbed in the depleted zone 13 on their first pass-through thereof may be reflected by the mirror-like metal forming the gate electrodes 15 and thereby have a second opportunity to create an electron-hole pair within the depleted region 13.

FIGS. 4 and 5 illustrate a second embodiment of the invention. In this embodiment, the ends of the optical fibers 17 inserted between the VFET pairs are not tapered as is illustrated in FIG. 2; instead, they retain their circular cross section 18 throughout their entire length. In this embodiment, the uniform coupling of the optical signal transmitted through the optical fibers 17 to each flanking pair of VFETs is accomplished by uniformly sloping the height of the upper surface 23 of the potting material 21 so that is resembles a ramp. This embodiment takes advantage of the fact that photons tend to leave the optical fiber 17 wherever there is an interface between the surface of the fiber 17 and an optical medium having a similar index of refraction. Thus, in this embodiment, the potting material obviates the need for a precision tapering of the end of each of the optical fibers 17, hence simplifying the manufacture of the device. In either embodiment, the gate electrodes 15 may be optionally deleted, thus converting the VFETs into diodes as is illustrated in FIG. 4. Such a configuration has the advantage of allowing an optical fiber to be disposed on both sides of every pillar 9 in the array, thus doubling the number of photons coupled to the depleted zones 13.

Figure 6:
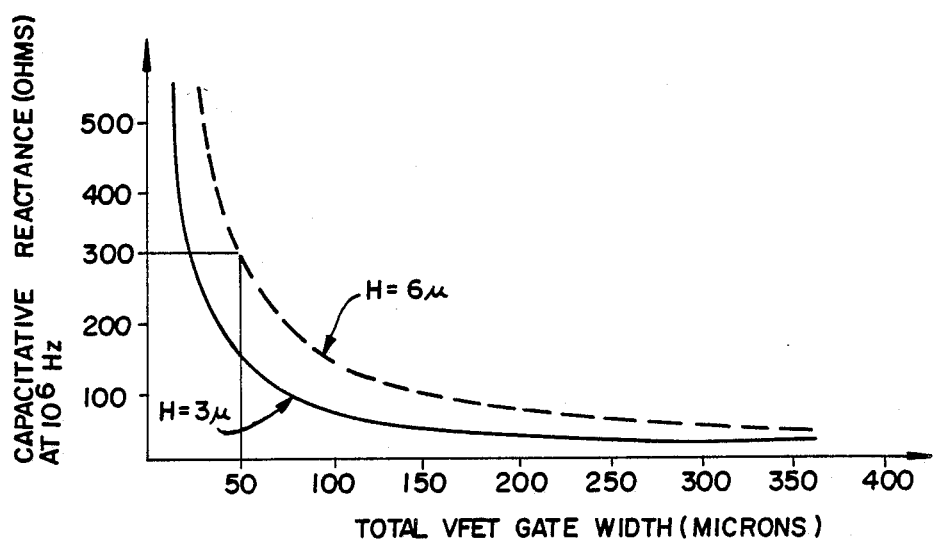
FIG. 6 is a graph illustrating the relationship between the reactance imposed upon a signal-carrying current conducted between the source and drain electrodes of a particular VFET transistor and the total width of the VFET gate.

FIG. 6 illustrates the dependency between the total VFET gate width Wg, and the capacitative reactance that exists between the source and drain electrodes 5 and 11 at 10 GHZ. In a conventional planar, circular photodiode having a diameter of approximately 2 mils., capacitative reactance is about 50 ohms or less. However, as the above chart indicates, the capacitative reactance in the instant invention is approximately 150 ohms at a gate width of approximately 50 microns where the height H of the depleted zone is approximately 3 microns. This resistance may be increased to over 300 ohms if the height of the depleted zone is increased to 6 microns, or if the gate width Wg is decreased to 25 microns. In any case, it is clear that microwave signal losses due to parasitic capacitances may be reduced by at least a factor of three in the instant invention, and even by factors of ten or more by the proper dimensioning of both the height H of the depleted zone 13 of the VFETs, and by the minimization of the width Wg of the VFET gates.

Figure 7:
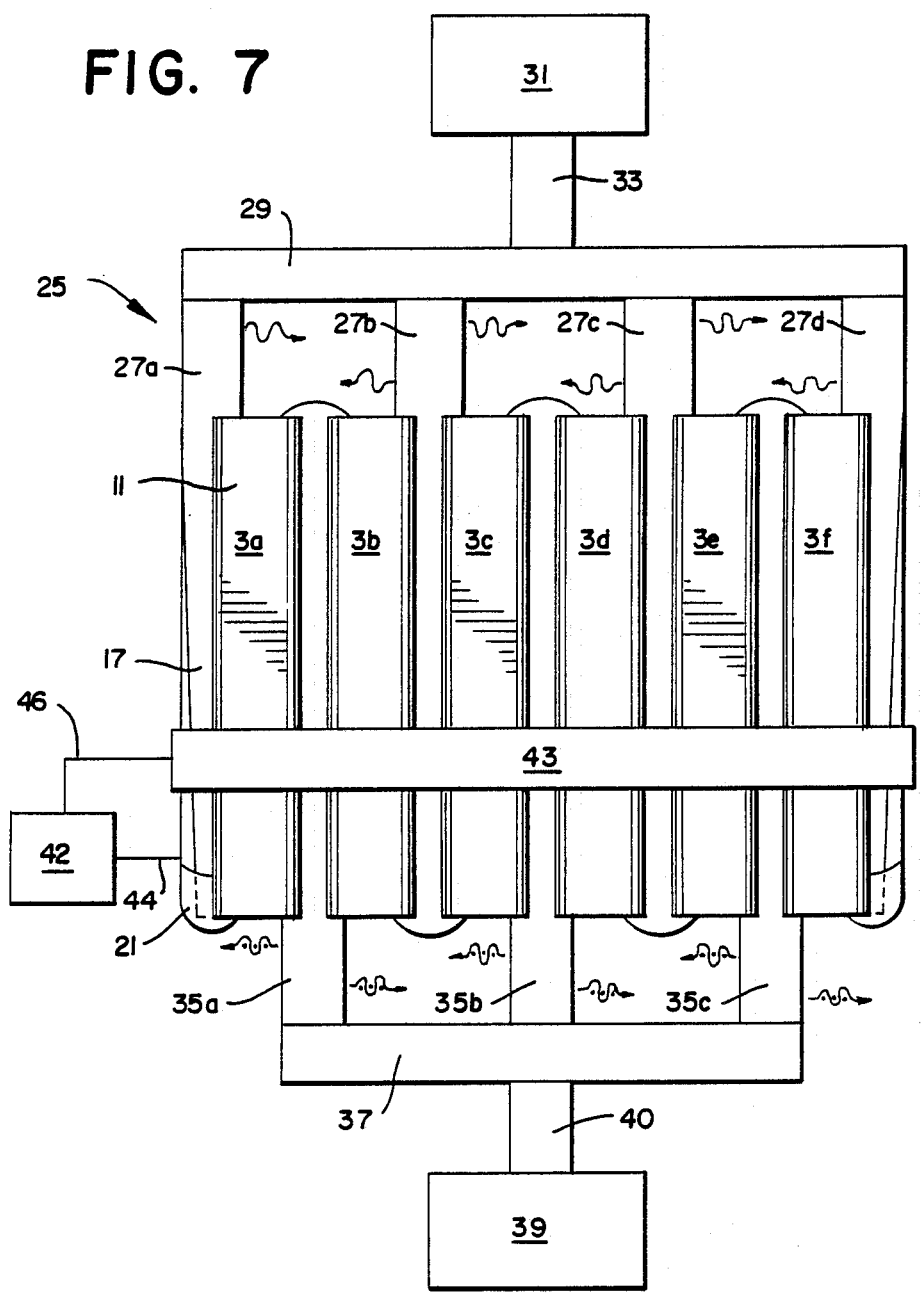
FIG. 7 is a plan view of the optical sensor of the invention as used as a heterodyne optical sensor demodulator.

With reference now to FIG. 7, the optical sensor 1 of the invention may advantageously be used as a heterodyne optical sensor-demodulator 25. In this embodiment of the invention, one set of optical fibers 27a, 27b, 27c and 27d extends through every other groove defined by the parallel array of VFETS 3a-3f. Each of these optical fibers 27a-27d is coupled together by an optical coupling 29 (illustrated in schematic), which is in turn optically coupled to a optical modulated signal source 31 by way of central optical conduit 33. Another set of optical fibers 35a-35c extends through the remaining grooves defined by the parallel array of VFETS 3a-3f in the manner shown. These optical fibers 35a-35c are coupled together by way of an optical coupling 37 which is in turn optically coupled to an optical modulated oscillator frequency source 39 by way of optical cable 40. An amplifier 42 is connected between the source electrode 5, and a connector 43 which electrically connects all of the drain electrodes 11 of the VFETs 3a-3f.

In operation, each VFET 3a-3f receives photons on one side of its depleted zone 13 from the source 31 of modulated optical signals (represented as undotted wavy arrows) and photons from the source 39 of oscillate or modulated optical signals (represented by dotted wavy arrows). The resulting pattern of optical interference created at the interface of the two different optical signals passing through each of the VFETS 3a-3f creates an intermediate frequency voltage between the source electrode 5 and the drain electrodes 11 which is conducted into the amplifier 42 by way of cables 44 and 46, respectively. The resulting output intermediate frequency wave form generated by the amplifier 42 can then be filtered in conventional fashion by band pass filters for useful purposes. For example, the source 31 of modulated optical signals may constitute 1,000 telephone channels frequency staggered from one another in 10 kilohertz steps so that any specific channel may be separated from the synthesized and amplified wave form generated by the amplifier 42 by state-of-the-art band pass filters. The broad band width and rapid response time of the VFETS and the very high frequency signals which can be conducted to them by the two sets of optical fibers 27a-27d and 35a-35c result in a heterodyne optical sensor-modulator 25 of high capability but compact size.

I claim:

1. An optical sensor semiconductor device, comprising:
   a vertically configured substrate of semiconductor material connected between a source means and a drain means and having first and second opposing sides, each of which are transverse with respect to said source and drain means, said substrate having a doped region in electrical contact with said source and drain means, a depleted region disposed within said doped region that traverse said first and second opposing sides, and a gate means disposed on said first side over said depleted region, and
   a fiber-optical conduit having an end that is disposed on said second side over said depleted region in spaced relation thereto for transmitting an optical signal directly into said depleted region and thereby creating a flow of electrical charges therein.

2. An optical sensor semiconductor device as defined in claim 1, wherein said end of said optical conduit is tapered in the vicinity of said depleted region to increase the amount of optical coupling between said fiber-optical conduit and said substrate.

3. An optical sensor semiconductor device as defined in claim 1, wherein said substrate is formed from gallium arsenide.

4. An optical sensor semiconductor device as defined in claim 1, wherein said end of said optical conduit is secured against said second side by a transparent low dielectric potting material that maintains a space of between about 0.05 and 0.02 microns between said conduit and said depleted region 5. An optical sensor semiconductor device as defined in claim 4, wherein said potting material is polyamide.

6. An optical sensor semiconductor device as defined in claim 1, wherein said gate means includes an electrode formed from a light-reflective metal for reflecting the optical signals transmitted by the fiber-optical conduit back through the depleted region.

7. An optical sensor semiconductor device as defined in claim 1, wherein said fiber-optical conduit is a single fiber-optical fiber having a second end optically coupled to a source of optical signals.

8. An optical sensor semiconductor device as defined in claim 1, wherein said substrate, source and drain means are a vertical field effect transistor.

9. An optical sensor semiconductor device as defined in claim 1, wherein said first and second opposing sides of said substrate are sufficiently close together so as to allow said single gate means to selectively control the flow of charges through said depleted region.

10. An optical sensor semiconductor device as defined in claim 1, wherein said gate means is dimensioned so that the reactance of the capacitative leakage that said gate means induces between said source and drain means is greater than 100 ohms for light at a frequency of $10^{10}$ hertz.

11. An optical sensor semiconductor device, comprising:
    a parallel array of vertical field effect transistors, each of which includes a substrate of semiconductor material disposed between a source means and a drain means, each substrate including a doped region divided by a depleted region and a gate means disposed on one side of each substrate for controlling the flow of charges therethrough, and
    at least one fiber-optical conduit disposed in a recess defined by the sides of the substrates of two adjacent transistors for transmitting an optical signal into the depleted region of at least one of the substrates of said transistors.

12. An optical sensor semiconductor device as defined in claim 11, wherein the gate means of the substrates of adjacent transistors are disposed over different sides of these substrates, and said fiber-optical conduit is disposed in a recess defined by opposing substrate sides, neither of which includes a gate means such that the signal emanated from the fiber optical conduit strikes the depleted regions of both adjacent transistors.

13. An optical sensor semiconductor device as defined in claim 11, wherein the width of the gate means of each transistor is selected so that the reactance of the capacitative leakage that said gate means induces between the source and drain means is greater than 50 ohms for light at a frequency of $10^{10}$ hertz.

14. An optical sensor semiconductor device as defined in claim 11, wherein the width of the gate means of each transistor is less than about 50 microns to minimize capacitative leakage through each transistor.

15. An optical sensor semiconductor device as defined in claim 11, wherein the width of the gate means of each transistor is less than about 10 microns to minimize capacitative leakage through each transistor.

16. An optical sensor semiconductor device as defined in claim 11, wherein said conduit is a singlemode optical fiber.

17. An optical sensor semiconductor device as defined in claim 16, wherein the sides of said fiber adjacent to the depleted regions of said transistors are tapered to increase the amount of optical coupling between said fiber and said regions.

18. An optical sensor semiconductor device as defined in claim 12, wherein each of the gate means includes an electrode formed from a light reflective metal that reflects back a portion of the optical signal back through the depleted regions of each of the adjacent transistors.

19. An optical sensor semiconductor device as defined in claim 11, wherein the substrate of each transistor is formed from gallium arsenide.

20. An optical sensor semiconductor device, comprising:
a parallel array of vertical field effect transistors, each of which includes a substrate of doped gallium arsenide disposed between a source means and a drain means, each doped substrate having first and second opposing sides that are traversed by a depleted region, and a gate means including a light reflective electrode disposed on the first side of the substrate for controlling a flow of photo charges induced in said region by light, and
at least one single-mode optical fiber disposed adjacent the second side of the substrate over the depleted region for transmitting an optical signal into said depleted region,
wherein the light reflective electrode of said gate means reflects a portion of said signal back through said depleted region a second time.

21. An optical sensor semiconductor device as defined in claim 20, wherein the side of the optical fiber adjacent to the second side of the substrate is tapered to increase the amount of optical coupling between said fiber and said depleted region.

22. An optical sensor semiconductor device as defined in claim 20, wherein the width of the electrode of said gate means is selected so that the reactance of the capacitative leakage that occurs between the source and the drain is greater than 50 ohms when the modulation frequency of the light used to transmit the optical signal is about $10^{10}$ hertz.

23. An optical sensor semiconductor device as defined in claim 21, wherein the tapered side of the optical fiber is spaced about 0.10 microns from the second side of the substrate by a transparent potting material having a relative dielectric constant of between about 1.0 and 2.0.

24. An optical sensor semiconductor device as defined in claim 20, wherein the optical fiber is formed from fused silica to lessen capacitative leakage through the transistors.

25. An optical sensor semiconductor device for mixing two different optical signals of different frequencies and generating an electrical current whose voltage fluctuates at a frequency that is between the two different frequencies of said optical signals, comprising:
at least one vertical field effect transistor that includes a substrate of semiconductor material disposed between a source means and a drain means, said substrate having a doped region and a depleted region; and
first and second fiber-optical conduits flanking opposite sides of the doped region of the substrate for transmitting first and second optical signals of different frequencies into said depleted region such that said region is exposed to an optical interference pattern generated at the interface of said two optical signals 26. An optical sensor according to claim 25, wherein said first and second fiber-optical conduits are optically coupled to a source of an optical modulation signal and a source of an optical oscillator signal, respectively.

27. An optical sensor according to claim 26, wherein each of said fiber-optical conduits is a single-mode optical fiber.

28. An optical sensor according to claim 27, wherein the sides of each fiber adjacent to the depleted region of said substrate are tapered to increase the amount of optical coupling between said fiber and said region.

29. According to claim 25, wherein said first and second fiber-optical conduits are secured adjacent to said depleted by a transparent potting material.

* * * * *